United States Patent
Muralimanohar et al.

(10) Patent No.: US 8,537,634 B2
(45) Date of Patent: Sep. 17, 2013

(54) PARALLELIZED CHECK POINTING USING MATS AND THROUGH SILICON VIAS (TSVS)

(75) Inventors: Naveen Muralimanohar, Santa Clara, CA (US); Norman Paul Jouppi, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 55 days.

(21) Appl. No.: 13/259,128

(22) PCT Filed: Nov. 13, 2009

(86) PCT No.: PCT/US2009/064464
§ 371 (c)(1),
(2), (4) Date: Sep. 22, 2011

(87) PCT Pub. No.: WO2011/059448
PCT Pub. Date: May 19, 2011

(65) Prior Publication Data
US 2012/0017065 A1    Jan. 19, 2012

(51) Int. Cl.
*G11C 8/00*    (2006.01)
*G11C 5/02*    (2006.01)

(52) U.S. Cl.
CPC ............................ *G11C 5/02* (2013.01)
USPC .......... 365/230.03; 365/189.02; 365/189.011; 365/189.04; 365/230.02; 365/230.01

(58) Field of Classification Search
CPC .......... G11C 5/02; G11C 5/04; G11C 7/1006; G11C 7/1051; G11C 7/1078; G11C 11/4096; G11C 7/1048
USPC .......... 365/230.03, 189.011, 189.02, 189.04, 365/189.05, 230.02
See application file for complete search history.

(56) References Cited

U.S. PATENT DOCUMENTS

| | | |
|---|---|---|
| 7,330,942 B2 | 2/2008 | Dinechin et al. |
| 2008/0077767 A1 | 3/2008 | Khosravi et al. |
| 2009/0006714 A1 | 1/2009 | Durham et al. |
| 2009/0103345 A1 * | 4/2009 | McLaren et al. .............. 365/64 |

OTHER PUBLICATIONS

International Search Report and Written Opinion for PCT Application No. PCT/US2009/049036, mailed Feb. 1, 2010, pp. 11.

* cited by examiner

*Primary Examiner* — Thong Q Le (57) ABSTRACT

A system and method that includes a memory die, residing on a stacked memory, which is organized into a plurality of mats that include data. The system and method also includes an additional memory die, residing on the stacked memory, that is organized into an additional plurality of mats and connected to the memory die by a Through Silicon Vias (TSVs), the data to be transmitted along the TSVs.

14 Claims, 12 Drawing Sheets

PARALLELIZED CHECK POINTING USING MATS AND THROUGH SILICON VIAS (TSVS)

BACKGROUND

A Dual In-line Memory Module (DIMM) comprises a series of Random Access Memory (RAM) integrated circuits. These RAM integrated circuits typically employ Dynamic-RAM (DRAM) cells for storing data. A DIMM is mounted on a printed circuit board and designed for use in compute blades, personal computers, workstations or servers. Through the use of DIMM(s), fast data check pointing can be facilitated.

Check pointing is a technique for inserting fault tolerance into computing systems. It includes, for example, storing a snapshot of the current application state, and using it for restarting the execution of an application in case of failure.

BRIEF DESCRIPTION OF THE DRAWINGS

Some embodiments of the invention are described, by way of example, with respect to the following figures.

DETAILED DESCRIPTION

Illustrated is a system and method for parallelized check pointing using DIMMs with stacked memory that includes vertically integrated memory dies. Parallelized check pointing, as used herein, refers to multiple mats in a DRAM die transferring data to the stacked die simultaneously using TSVs, a TSV controller, and an address generator circuit in each mat or a group of mats. Stacked memory, as used herein, includes two or more layers of active electronic components, integrated vertically into a single stack of memory die that is part of a DRAM chip. Stacked memory may be manufactured through techniques including monolithic, wafer-on-wafer, die-on-wafer, or die-on-die techniques. Vertical integration is facilitated through the use of TSVs. The memory dies in a three-dimensional (3D) stack can either be homogeneous or heterogeneous. Homogenous, as used herein, includes the layering of memory dies in a one to one configuration, where similar memory types are vertically layered. Heterogeneous, as used herein, includes the layering of memory dies in a one-to-many configuration, or where distinct memory types are vertically layered.

In some example embodiments, memory dies are organized into one or more mats per memory die. Each memory die in the stacked memory can be sub-divided into one or more groups of sub-arrays. A group of sub-arrays is a mat. A sub-array includes an array of memory cells. For example, a die may be divided into one or more groups of four sub-arrays. In addition to at least one sub-array, a mat includes at least one of a local decoder, predecoder, multiplexor, de-multiplexor, address generation module, TSV controller, and other logical circuits necessary to read or write data from or to one or more of the sub-arrays. Through the use of these logic circuits, parallelism with respect to the reading and writing of data may be achieved. Mats residing on a common memory die are connected through the use of a plurality of interconnects (e.g., a center bus, or H-tree segments), while mats residing on distinct memory dies that are part of the same stacked memory are vertically integrated through the use of TSVs. In the case of a homogenous stacked memory, TSVs are used to connect the memory of one mat residing on one memory die to a similar memory type residing on an additional mat. This additional mat resides on another memory die. In the case of heterogeneous stacked memory, TSVs are used to connect one type of memory residing on a mat to a distinct type of memory residing on additional mat. This additional mat resides on another memory die. Through the use of TSVs parallelization can be maintained between distinct memory dies residing within the same stacked memory.

In some example embodiments, the mats within a stacked memory are organized in homogenous manner such that mats utilizing similar types of memory are connected across a plurality of dies using TSVs. For example, a first mat residing on a first die that is part of a stacked memory is connected to a second mat residing on a second die that is part of the stacked memory. The memory type used by both the first and second dies may be Dynamic Random Access Memory (DRAM), or other non-volatile memories (e.g., flash, Magnetoresistive Random Access Memory (MRAM), Phase-Change Random Access Memory (PCRAM) memories), Memristors, or some other suitable type of memory.

In some example embodiments, the mats within a stacked memory are organized in heterogeneous manner such that mats utilizing distinct types of memory are connected across a plurality of dies using TSVs. For example, a first mat residing on a first die is connected to a second mat residing on a second die with both the dies being part of the same stacked memory. The memory type used by both the first and second dies is distinct such that the first die may use DRAM, while the second die may use flash memory.

In some example embodiments, heterogeneous stacked memory is used to facilitate heterogeneity with respect to memory area/density. In one example embodiment, where memories in different dies have different area characteristics, data may be written from one mat residing on one memory die, to a plurality of other mats residing on a plurality of distinct memory dies. Each of these mats residing within the same stacked memory. This writing may be based upon the one mat having memory that is less dense, as compared to another mat residing on the stacked memory.

In some example embodiments, where stacked dies exhibit heterogeneity with respect to memory delay, data is written from one mat residing on one memory die, to a plurality of other mats residing on a plurality of distinct memory dies in a pipelined manner. For example, data from a mat with fast memory reads (or writes) data to a mat in a different die with slow memory. Since the mat with a high latency takes more time to complete its operation, the fast mat may interleave accesses to multiple mats to hide the delay.

Figure 1:
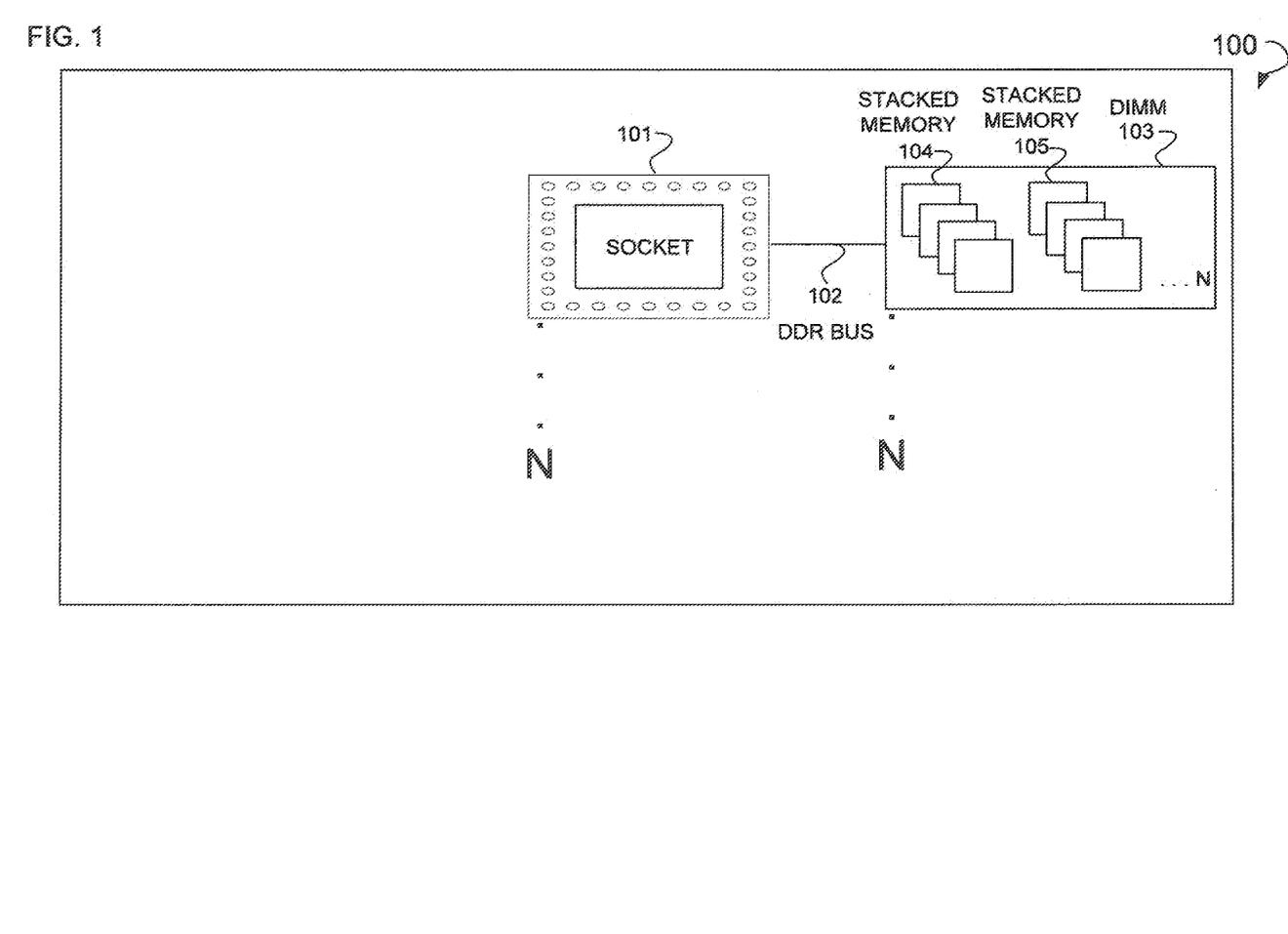
FIG. 1 is a diagram of a compute blade, according to an example embodiment, illustrating a DIMM(s) operatively connected to a processor socket.

FIG. 1 is a diagram of an example compute blade 100 illustrating a DIMM(s) operatively connected to a processor socket. Shown is a plurality of sockets 101, and Central Processing Units (CPUs) associated therewith, utilized by the compute blade 100 to generate read or write commands relating to memory. Operative connected, via a Double Data Rate (DDR) bus 102, to the socket 101 is a DIMM 103. Residing as a part of this DIMM 103, is stacked memory 104 and stacked memory 105. This DIMM 103 may include a plurality of stacked memory (e.g., 8 modules of stacked memory in addition to stacked memory 104 and 105). Further, the stacked memory may include DRAM, MRAM, PCRAM, Memristors, or some other suitable type of memory organized in a homogenous or heterogeneous manner.

Figure 2:
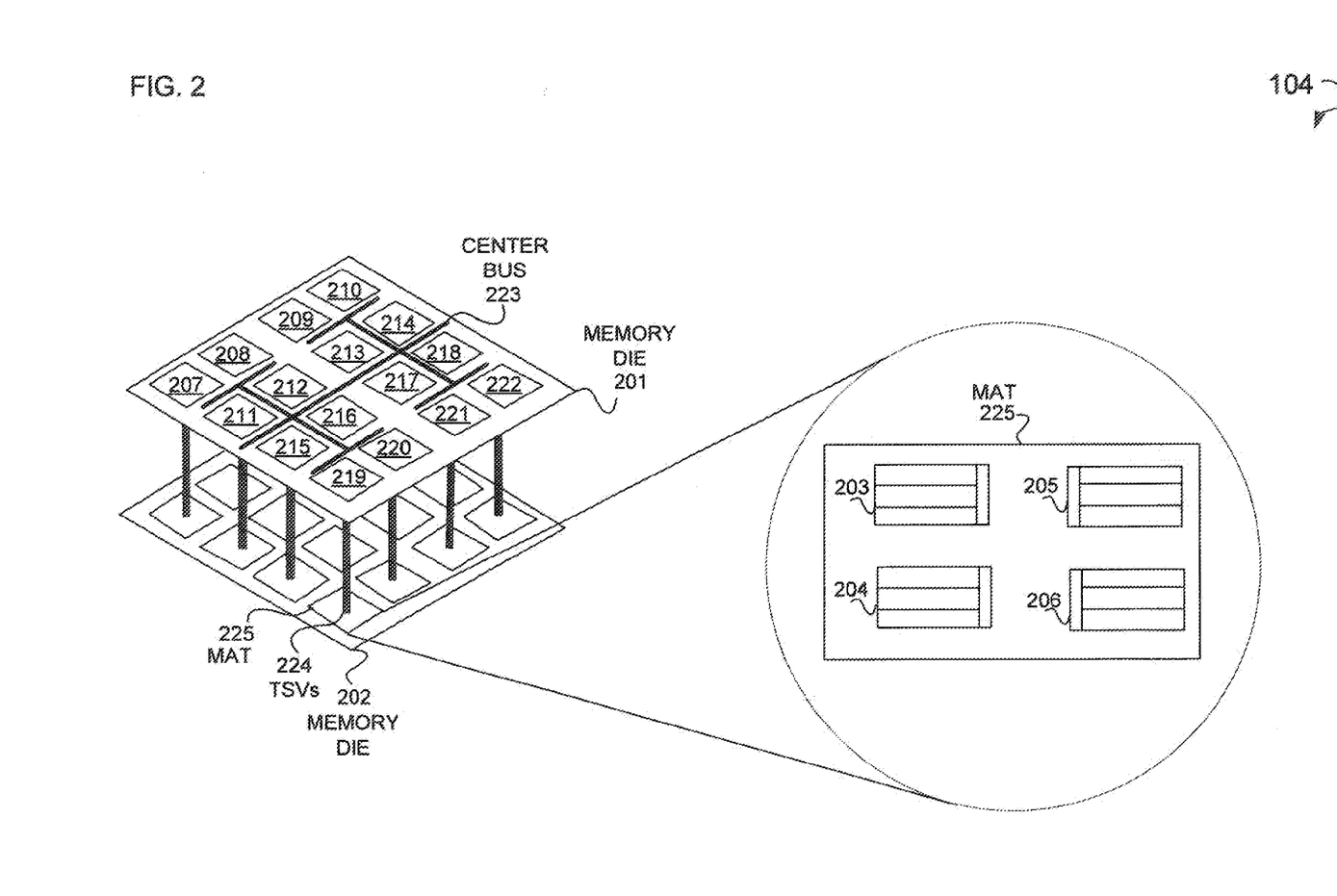
FIG. 2 is a diagram of stacked memory, according to an example embodiment, illustrating homogeneous memory architecture.

FIG. 2 is a diagram of stacked memory 104 illustrating example homogeneous memory architecture. Shown is a memory die 201 and memory die 202. Residing on the memory die 201 is a plurality of mats. These mats include mats 207-222. Operatively connecting each of these mats 204-219 is one or more interconnects in the form of, for example, a center bus 223. Further, operatively connecting the memory die 201 and the memory die 202 is a plurality of TSVs. For example, illustrated is the TSVs 224 that operatively connects the mat 219 to the mat 225. Also shown is an exploded view of the mat 225 illustrating the example sub-arrays 203-206 that reside on the mat 225. The TSVs 224 support the transmission of data between the memory die 201 and the memory die 202. As illustrated, homogeneous memory architecture has a one-to-one mapping between mats such that, for example, mat 219 maps to the mat 225. This one-to-one mapping is based upon each mat using the same type of memory.

Figure 3:
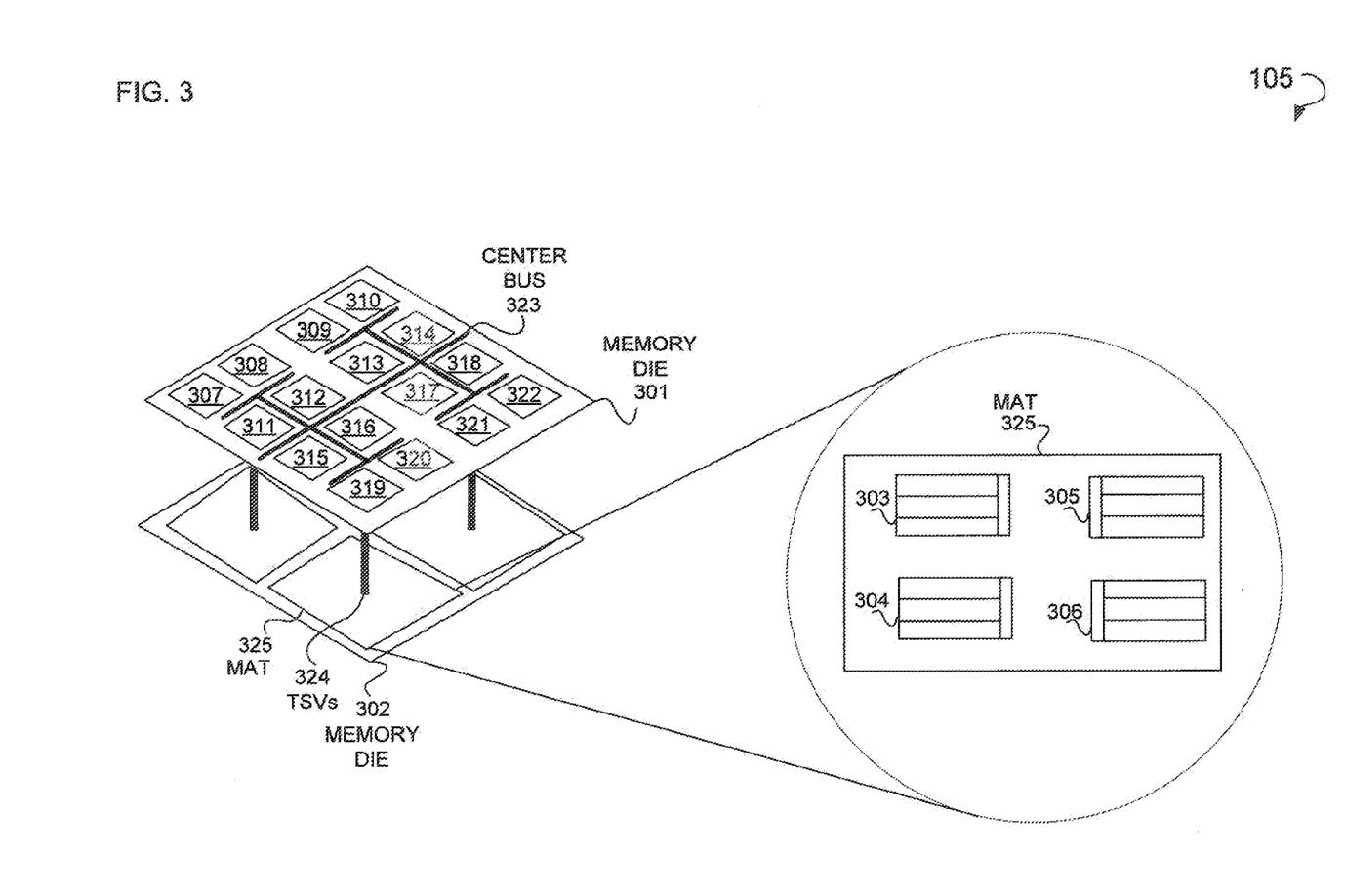
FIG. 3 is a diagram of a stacked memory, according to an example embodiment, illustrating heterogeneous memory architecture.

FIG. 3 is a diagram of an example of stacked memory 105 illustrating an example heterogeneous memory architecture. Shown are a memory die 301, and memory die 302. Residing on each of these memory dies 301-302 is a plurality of mats. For example, residing on the memory die 301 are mats 307-322. Operatively connecting these various mats 307-322 is one or more interconnects in the form of, for example, the center bus 323. In some example embodiments, the interconnects connecting the various mats can be disabled to save electrical power. This disabling may be implemented where, for example, TSVs are used to read or write data between mats. Further, operatively connecting the memory die 301 to the memory die 302 is the TSVs 324. In particular, TSVs 324 connects mat 319 to mat 325. As illustrated, mat 325 is larger in terms of area and includes a less dense type of memory as compared to mat 319. For example, memory die 301, which includes mat 319, may have sixteen mats with a total of sixty-four sub-arrays. By contrast, memory die 302, which includes mat 325, may have four mats with sixteen sub-arrays. Also shown is an exploded view of the mat 325 illustrating the example sub-arrays 303-306 that reside on the mat 325. The transmission of data between mats 319 and 325 along the TSVs 324 is one expression of heterogeneity, for it illustrates a memory die of less area writing or reading data to a memory die of greater area.

In some example embodiments, where mats of differing areas or delay/latency are connected via the TSVs, modifications to mats may need to be implemented to allow for communicate across the memory dies. For example, if mat 325 is larger in terms of area than mat 319, the memory die 302 can be sub-divided into multiple memory dies. Additionally, where these areas or delay/latency differ, the granularity of the TSVs connection can be changed such that two or more mats of memory die 301 can be combined and connected via the TSVs to a mat in memory die 302. Further, where unused silicon area exists on a memory die, the chip banks can be re-reorganized such that the unused silicon can be used. In some example embodiments, re-organization of the unused silicon can be used to reduce power overhead.

In some example embodiments, the relative granularity of the TSVs provides an opportunity to allow pipelined accesses across different sub-arrays residing on different memory dies. For example, assume that the TSVs bandwidth is "b-bits." During check pointing, data from memory die 301 is read at a rate of b-bits from a sub-array residing on memory die 301, and transferred to a counterpart sub-array in memory die 302. Using pipelining, memory die 301 can immediately initiate the next b-bits transfer of data from a sub-array of memory die 301 to the counterpart sub-array in memory die 302. This transfer can be initiated without having to wait for the previous transfer operation to complete since different sub-arrays in a mat are accessed in a pipelined manner. Further, by adjusting the number of sub-arrays that share TSV connections and the bandwidth of the TSVs 324, the wait time can be reduced. For example, a 3D design with a mat to mat connection (e.g., assuming each mat has four sub-arrays) can have a 4-way pipelining translating to a speed up of up to 4×.

Figure 4:
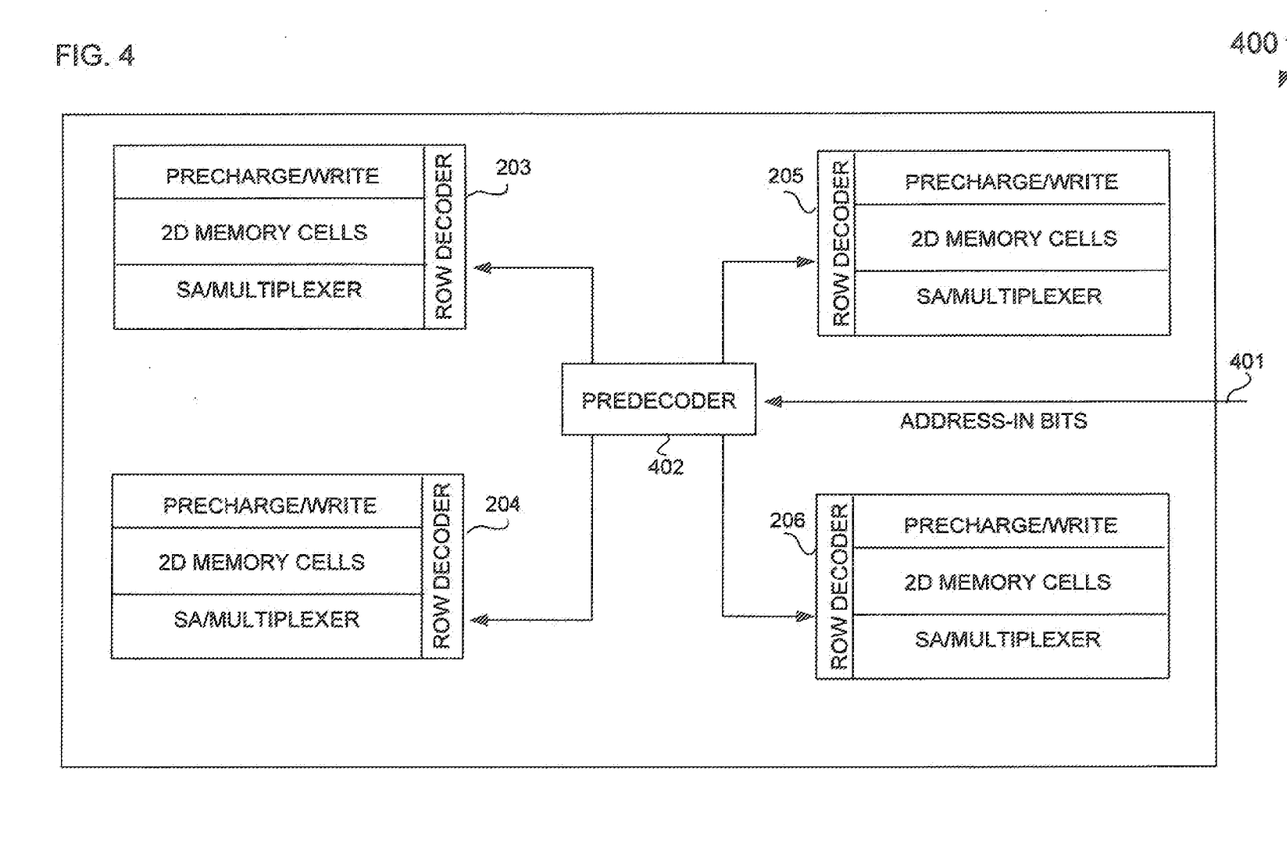
FIG. 4 is a diagram of a prior art mat, according to an example embodiment, illustrating the activating of memory cells for a read or write operation.

FIG. 4 is a diagram of an example prior art mat 400, illustrating the activating of memory cells for a read or write operation. Shown are the sub-arrays 203-206, and a predecoder module 402 that decodes address to access cells in the sub-arrays 203-206. An address is received as address-in bits 401 via an interconnect(s). Residing on each of the sub-arrays 203-206 is a pre-charge/write module, a connected two-dimensional memory cell, and a Sense Amplifier (SA)/multiplexer. Further, residing on each of the sub-arrays is a row decoder. In one example embodiments, part of the address is received and decoded for one or more of the sub-arrays 203-206 using the predecoder module 402. A row decoder on one or more of the sub-arrays 203-206 further decodes the remaining address bits for the purposes of writing or reading the data to a two-dimensional memory cell on the sub-array.

Figure 5:
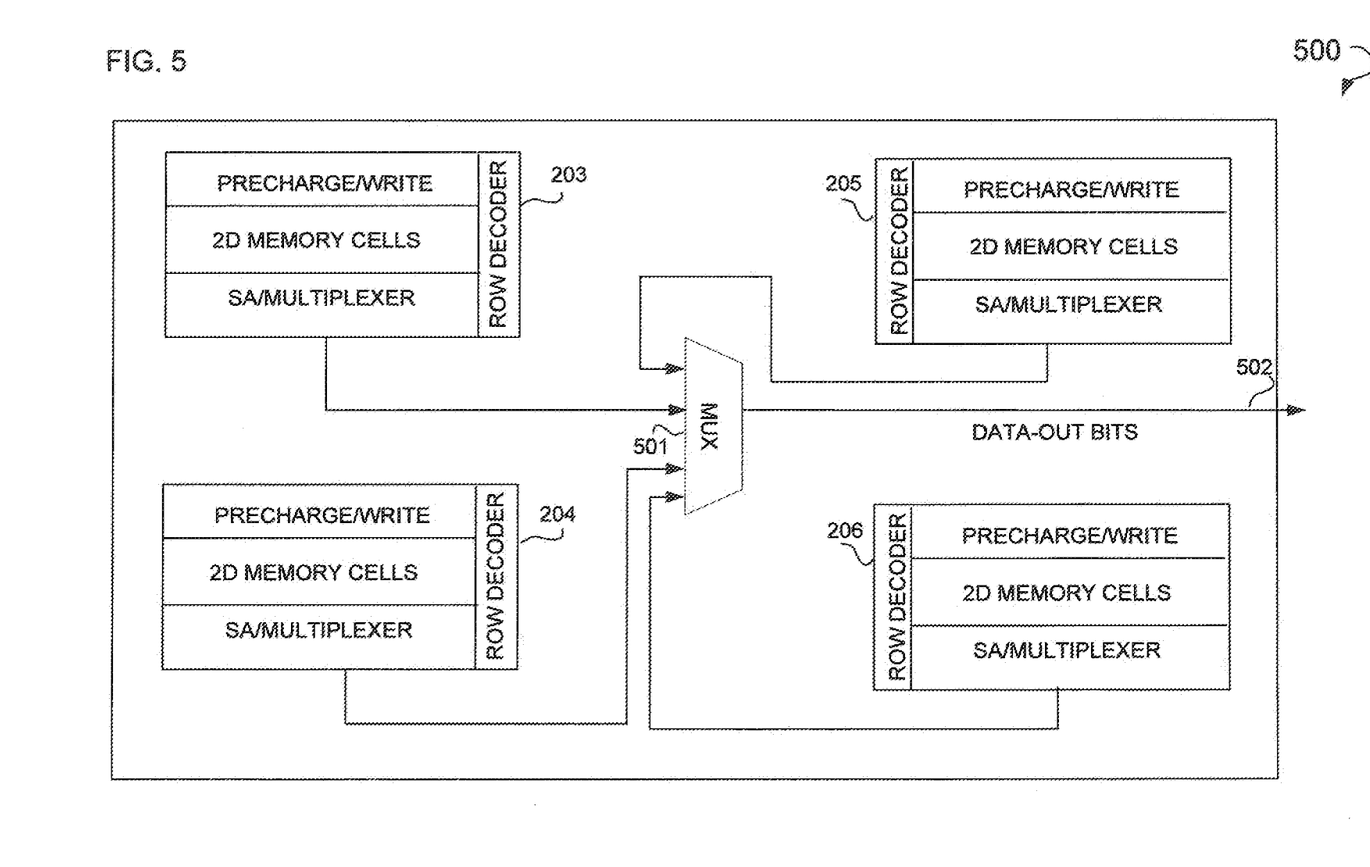
FIG. 5 is a diagram of a prior art mat, according to an example embodiment, illustrating the reading of data.

FIG. 5 is a diagram of an example prior art mat 500 illustrating the reading of data. Shown are the sub-arrays 203-206 from which data is to be read. This data is read from the sub-arrays 203-206 and routed through a multiplexor (mux) 501 as data-out bits 502 and sent along an interconnect(s). In some example embodiments, a tri-state buffer is used in lieu of the mux 501 in the reading of the data from the sub-arrays 203-206. Additionally, other example embodiments may use a global bus or other suitable basis to read data from the sub-arrays 203-206. This data may be routed to a memory controller, or other suitable device.

Figure 6:
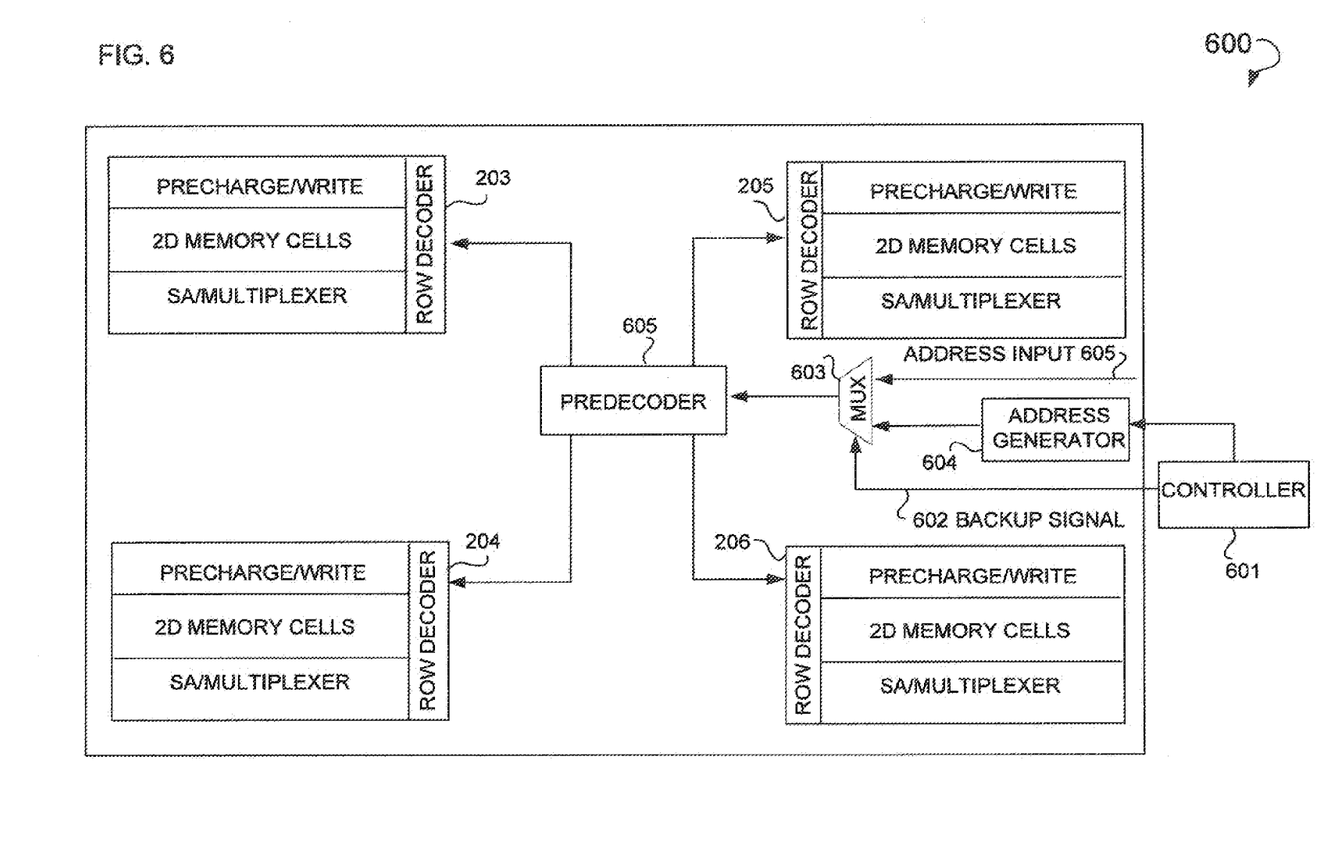
FIG. 6 is a diagram of a mat, according to an example embodiment, that uses an address generator module to activate memory cells for the purpose of reading or writing data during a parallelized check pointing process.

FIG. 6 is a diagram of an example mat 600 that uses an address generator module to activate memory cells for the purpose of reading or writing data during a parallelized check pointing process. Shown is a controller 601 that generates a backup signal 602 that instructs the mux 603 to retrieve addresses from the address generator 604. The controller 601 may be a DIMM controller, a memory controller, or some other suitable type of controller. The address generator 604 may be a counter that generates numeric values corresponding to the memory cell locations in the sub-arrays 203-206. Further, the controller 601 may also instruct the address generator 604 to start, set, reset, change, or otherwise modify the counter value (e.g., a clock value) associated with the address generator 604. In cases where no backup signal 601 is received, the mux 602 retrieves addresses from a bus denoted at address input 605. The addresses generated by the address generator 604, or retrieved from the bus, are used in reading or writing data from/to the sub-arrays 203-206. Where this backup signal 602 is received, the address generator 604 may generate addresses for each of the mats residing on a memory die for the reading or writing of data in parallel. Specifically, the addresses generated by the address generator 604 may be shared amongst the one or more mats residing on the memory die. In some example embodiments, a capacitor is implemented to address worse case peak power usage during the execution of a parallelized check pointing process as illustrated herein.

Figure 7:
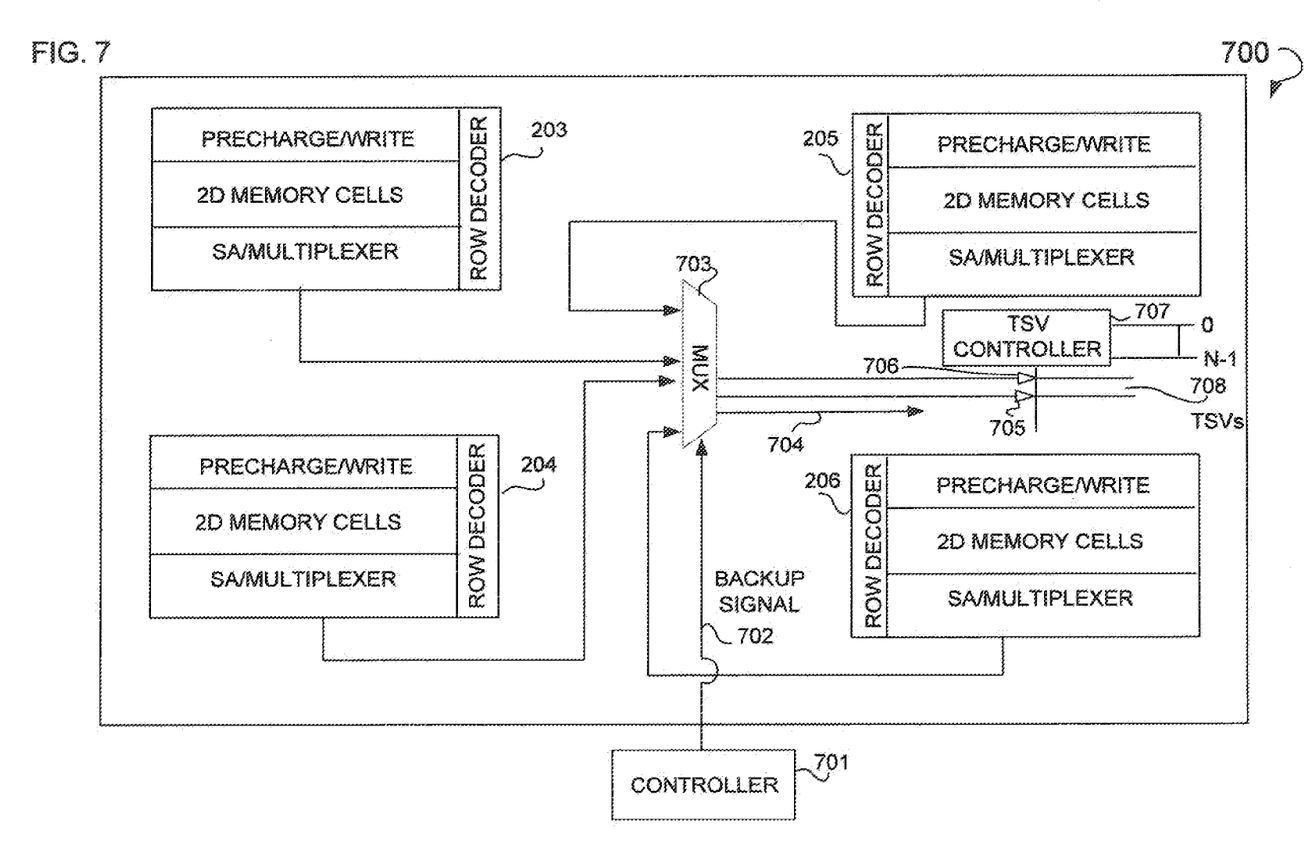
FIG. 7 is a diagram of a mat, according to an example embodiment, used to implement a read operation that utilizes a Through Silicon Vias (TSVs) controller in a parallelized check pointing process.

FIG. 7 is a diagram of an example mat 700 used to implement a read operation that utilizes a TSV controller in a parallelized check pointing process. Shown is a controller 701 that generates a backup signal 702 that is provided to the mux 703. The controller 701 may be DIMM controller, memory controller, or other suitable controller. The backup signal 702 instructs the mat 700 that data is to be read from the sub-arrays 203-206, and transmitted along the TSVs 708. A backup signal, as used herein, may be a bit value (e.g., "0" or "1"). In some example embodiments, if no backup signal 702 is provided, data is read from the sub-arrays 203-206 and transmitted along the output bus 704. As illustrated, where the backup signal 702 is received, the mux 703 retrieves data from one or more of the sub-array 203-206 and prepares the data for transmission on the TSVs 708. The TSV controller module 707 controls the placement of data on the TSVs 708. The data retrieved by the mux 703 is transmitted along the TSVs 708. Examples of the TSV controller module 707 include a deterministic controller (e.g., a counter), a TSV access control mechanism, or some other suitable device. Various tri-state buffers 705 and 706 are activated by the TSV controller 707 during the transmission of the data on the TSVs 708.

Figure 8:
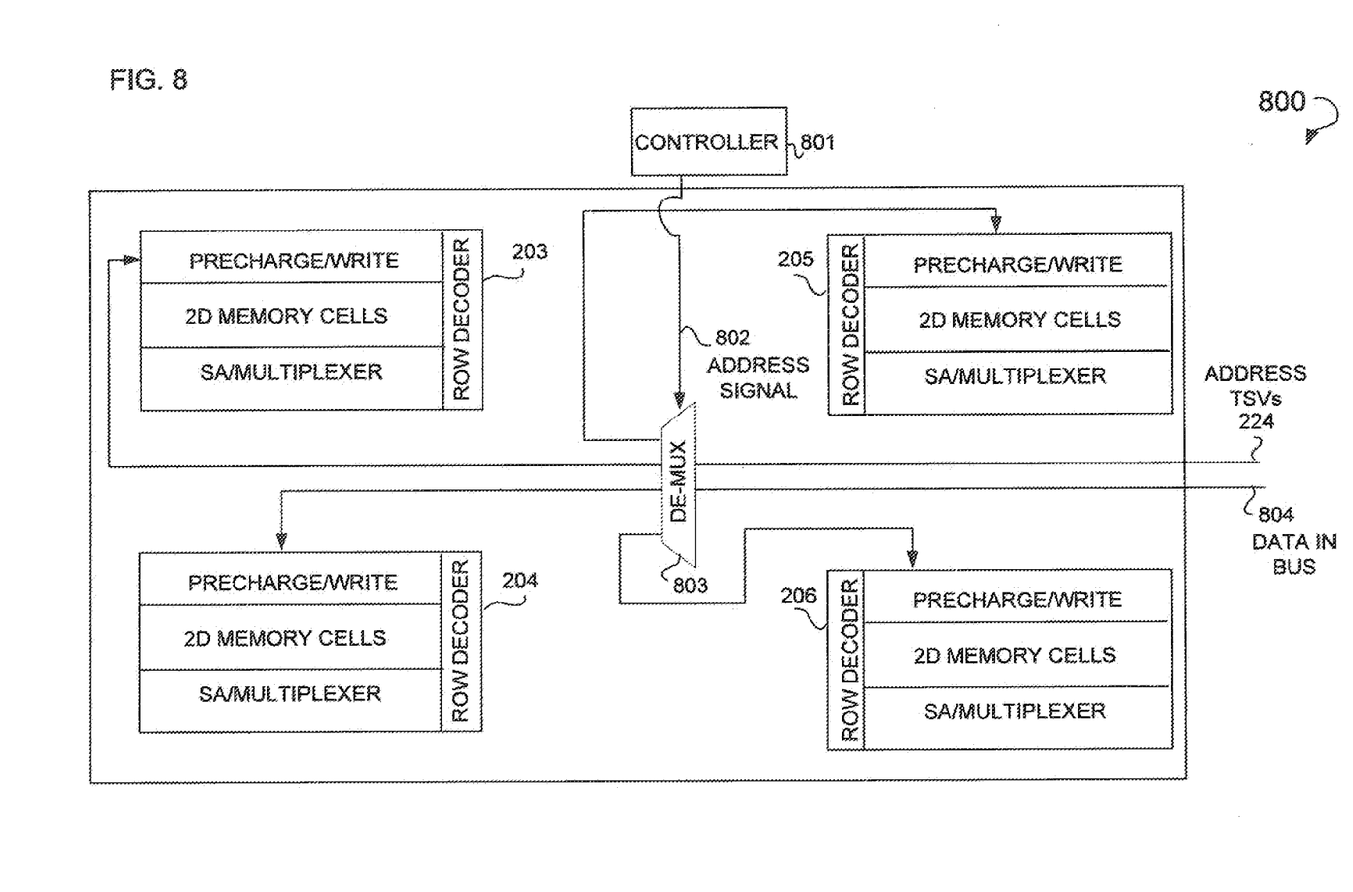
FIG. 8 is a diagram illustrating a mat, according to an example embodiment, used to implement a write operation to write data to a plurality of sub-arrays during a parallelized check pointing process.

FIG. 8 is a diagram illustrating an example mat 800 used to implement a write operation to write data to a plurality of sub-arrays during a parallelized check pointing process. Shown is a controller 801 that generates an address signal 802 a de-mux 803. The controller 801 may be a DIMM controller, memory controller, or other suitable device. Where this address signal 802 is received, the de-mux 803 retrieves data and/or memory addresses from the TSVs 224, and writes it to one or more of the sub-arrays 203-206, and memory cells associated therewith. In some example embodiments, the data is provided to the mat 800 by the mat 700 via the TSVs 708 that are managed by the TSV controller 707. Where the address signal 802 is not received, data is retrieved from the data in bus 804, and written to the sub-arrays 203-206, and memory cells associated therewith.

In some example embodiments, when there is a backup signal or checkpoint request from a memory controller, the contents of each mat in a top die is transferred to the corresponding mat in the backup memory. For example, the data of memory die 301 is transferred to memory die 302 (i.e., assuming that the memory die 302 acts as the main memory). As illustrated in FIGS. 6-8, since each mat is equipped with adequate logic to read or write data from memory cells, the backup operation across the entire memory can happen in parallel. The time to complete a backup operation is a function of the size (e.g., area and/or density) of the mat and the bandwidth of the interconnects (e.g., center buses, H-tree segments and TSVs) connecting the mats.

Figure 9:
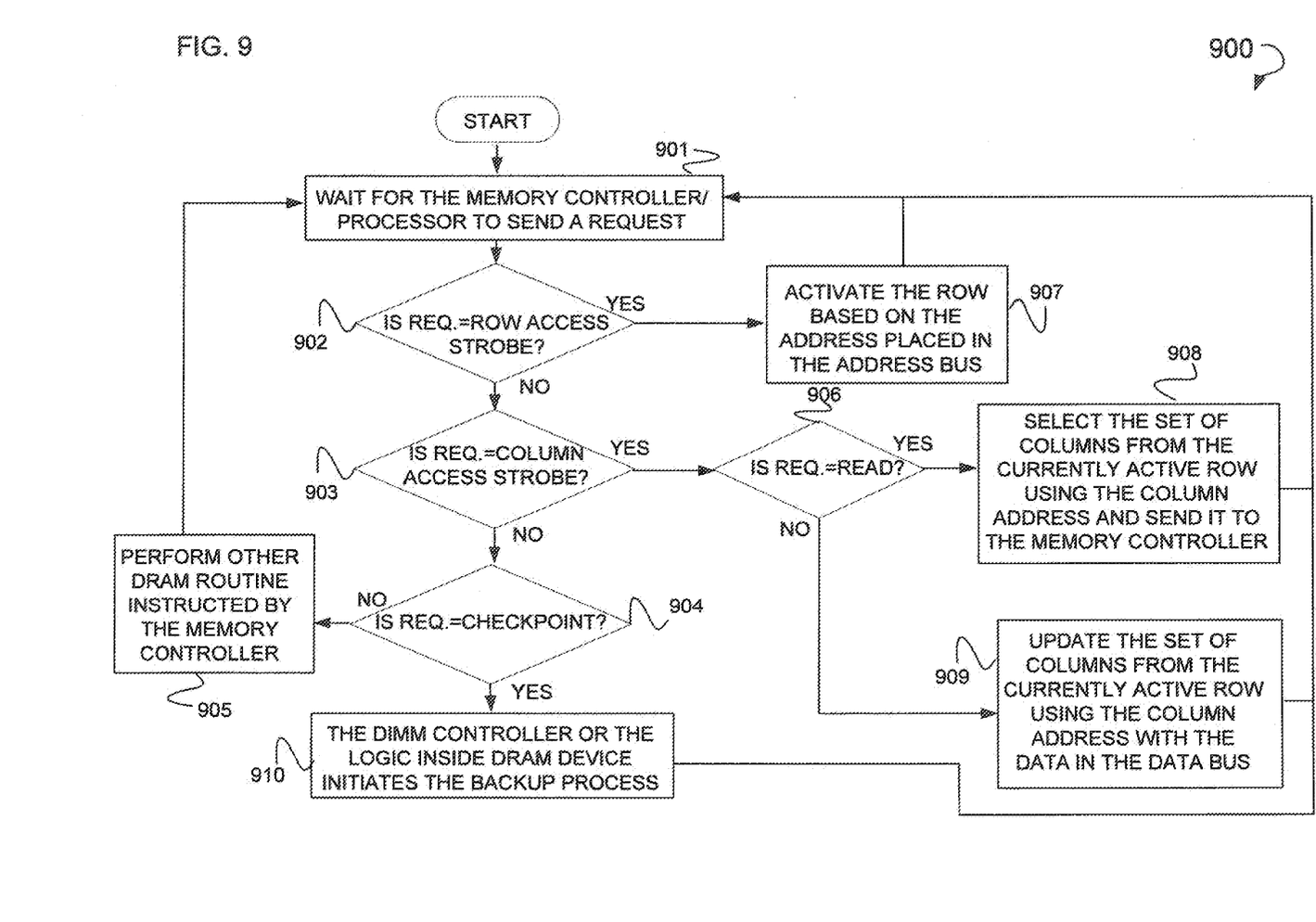
FIG. 9 is a flow chart illustrating a method, according to an example embodiment, executed to facilitate the reading or writing of data for the purpose of parallelized check pointing.

FIG. 9 is a flow chart illustrating an example method 900 executed to facilitate the reading or writing of data for the purpose of parallelized check pointing. This method 900 may be executed on the compute blade 100. An operation 901 is executed to wait for the processor (e.g., the CPU associated with the sockets 101) to send a check pointing request. A decision operation 902 is executed to determine whether the request is a memory row activation request. In cases where decision operation 902 evaluates to "no," a decision operation 903 is executed. In cases where decision operation 902 evaluates to "yes," an operation 907 is executed. Operation 907, when executed, activates the memory row based upon the address placed in the address bus. In some example embodiments, operation 907 may be executed by the controller 601. Decision operation 903 is executed to determine whether the request is a memory column activation request to be executed by the controller 601. In cases where decision operation 903 evaluates to "yes," a decision operation 906 is executed. In cases where decision operation 903 evaluates to "no," a decision operation 904 is executed. Decision operation 906 determines whether the request is a read request. This decision operation 906 may be executed by the controller 701. In cases where decision operation 906 evaluates to "yes," an operation 908 is executed. Operation 908, when executed, selects a set of columns from the currently active row using the column address and sends it to the controller 701 (e.g., a memory controller). In cases where decision operation 906 evaluates to "no," an operation 909 is executed. Operation 909 updates the set of columns from the currently active row using the column address, the updating performed using the data in the data bus. Operation 909 is performed using the controller 801. Decision operation 904 is executed to determine whether parallelized check pointing is required. In cases where decision operation 904 evaluates to "no," an operation 905 is executed. In cases where decision operation 904 evaluates to "yes," operation 910 is executed. Decision operation 904 may be executed by the controller 601. Operation 905 is executed to perform a DRAM routine as instructed by a memory controller. Operation 910 is executed by a controller (e.g., the controller 601) to initiate the backup process.

Figure 10:
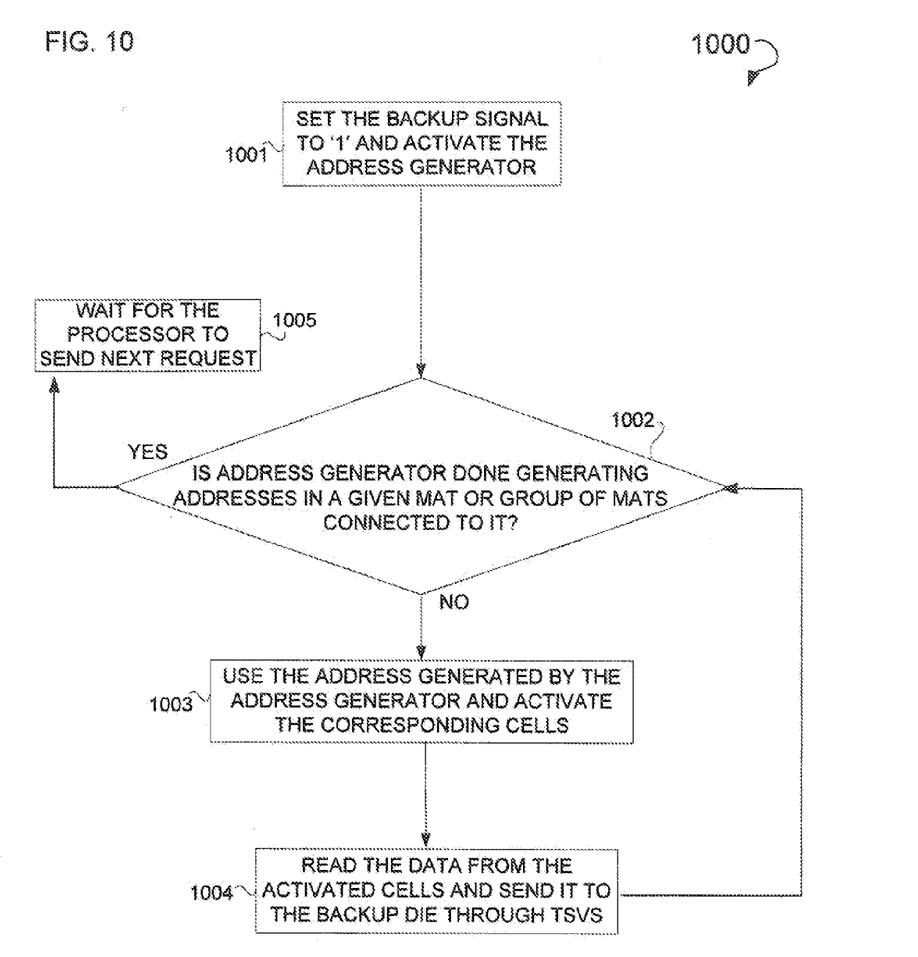
FIG. 10 is a flow chart illustrating a method, according to an example embodiment, to activate an address generator for the purpose of transmitting data along TSVs during a parallelized check pointing process.

FIG. 10 is a flow chart illustrating an example method 1000 to activate an address generator for the purpose of transmitting data along the TSVs during a parallelized check pointing process. Shown is an operation 1001 that is executed to set a backup signal (e.g., set to "1"), and to activate the address generator 604. This operation 1001 may be executed by the controller 601. A decision operation 1002 is executed to determine whether the address generator has finished generating addresses in a given mat or group of mats to which it is connected. In cases where decision operation 1002 evaluates to "no," the operation 1003 is executed. In cases where decision operation 1002 evaluates to "yes," operation 1005 is executed. Operation 1003 is executed to use the address generated by the address generator 604 to activate the corresponding cell represented by the address. This operation 1003 may be executed by the predecoder 605. Operation 1004 is executed to read data from the activated cells and send it to another die (e.g., a backup die) through the TSVs. Operation 1005 is executed to wait for the processor, associated with the socket 101, to send the next request (e.g., a backup request).

Figure 11:
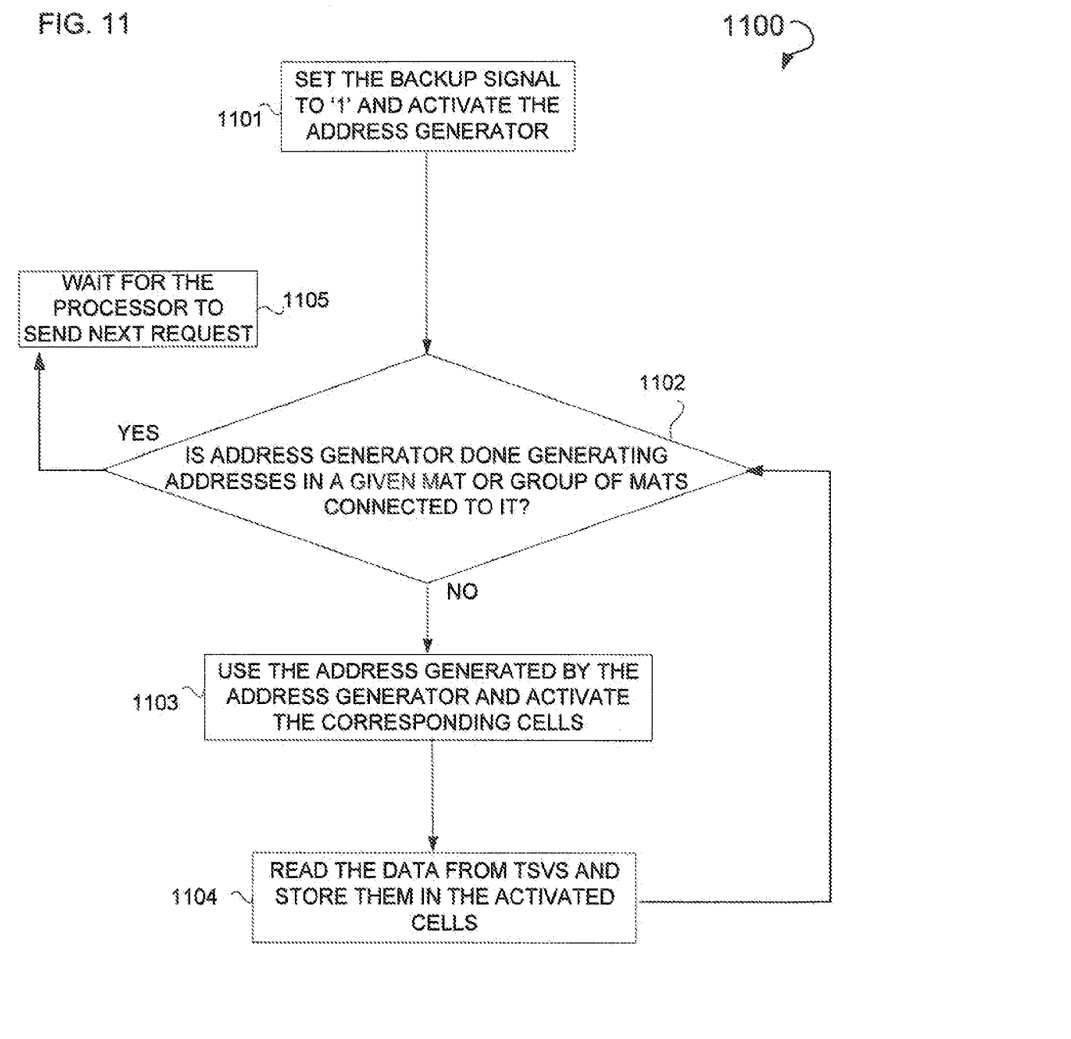
FIG. 11 is a flow chart illustrating a method, according to an example embodiment, to activate an address generator for the purpose of writing data to an activated memory cell during a parallelized check pointing process.

FIG. 11 is a flow chart illustrating an example method 1100 to activate an address generator for the purpose of writing data to an activated memory cell during a parallelized check pointing process. Shown is an operation 1101 that is executed to set a backup signal (e.g., set to "1"), and to activate the address generator 604. This operation 1101 may be executed by the controller 601. A decision operation 1102 is executed to determine whether the address generator has finished generating addresses in a given mat or group of mats to which it is connected. In cases where decision operation 1102 evaluates to "no," the operation 1103 is executed. In cases where decision operation 1102 evaluates to "yes," operation 1105 is executed. Operation 1103 is executed to use the address generated by the address generator 604 to activate the corresponding cell represented by the address. This operation 1103 may be executed by the predecoder 605. Operation 1104 is executed to read data from the TSVs and store it in the activated cells. Operation 1105 is executed to wait for the processor, associated with the socket 101, to send the next request (e.g., a backup request).

Figure 12:
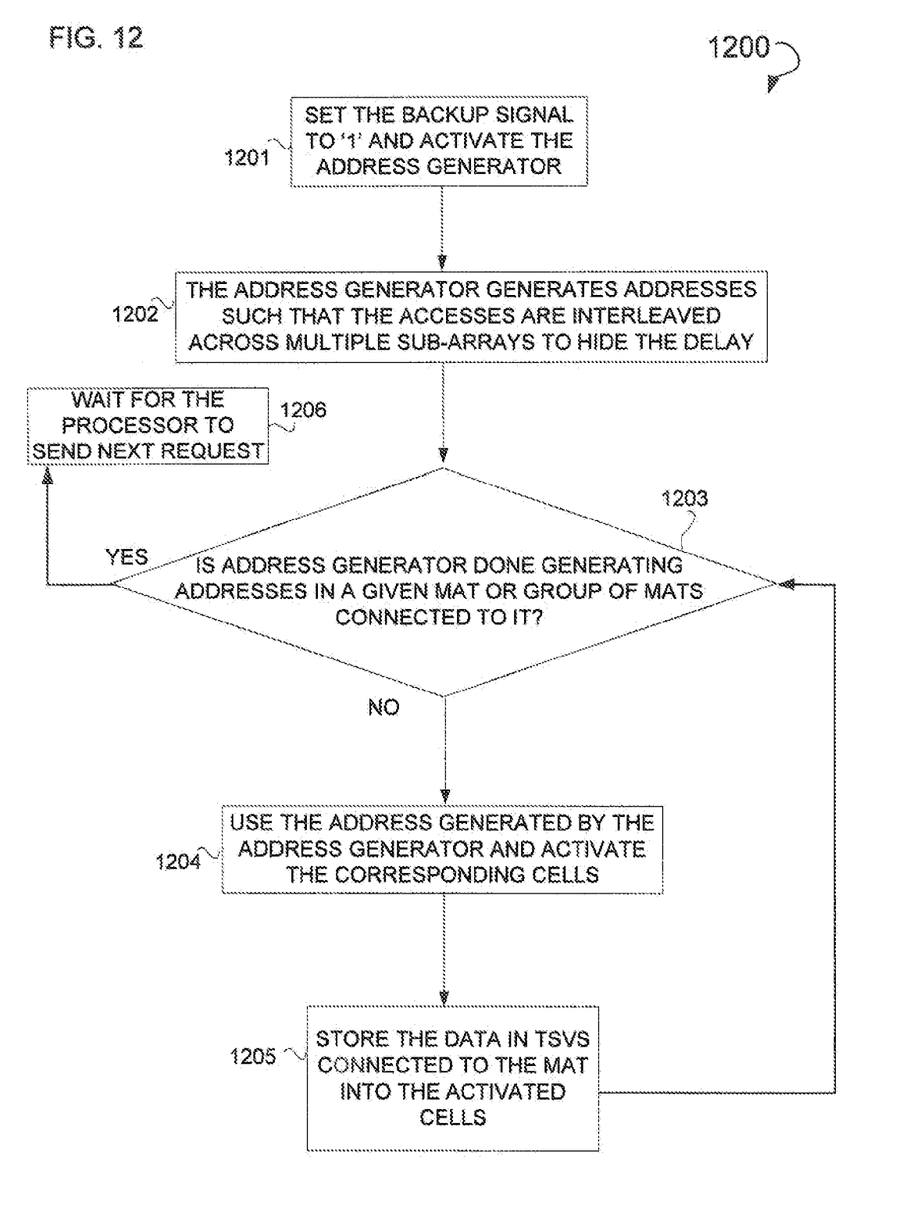
FIG. 12 is a flow chart illustrating a method, according to an example embodiment, to activate an address generator for the purpose of writing data to an activated memory cell during a parallelized check pointing process that involves heterogeneous memory.

FIG. 12 is a flow chart illustrating an example method 1200 to activate an address generator for the purpose of writing data to an activated memory cell during a parallelized check pointing process that involves heterogeneous memory. Shown is an operation 1201 that is executed to set a backup signal (e.g., set to "1"), and to activate the address generator 604. This operation 1201 may be executed by the controller 601. An operation 1202 is executed to generate the addresses such that the addresses are interleaved across multiple sub-arrays. As used herein, interleave includes the generation of memory addresses that correspond to non-contiguous address locations. For example, where interleaving is used, addresses may be generated by the address generator such that these addresses round robin between different sub-arrays connected to the TSVs. A decision operation 1203 is executed to determine whether the address generator has finished generating addresses in a given mat or group of mats to which it is connected. In cases where decision operation 1203 evaluates to "no," the operation 1204 is executed. In cases where decision operation 1203 evaluates to "yes," operation 1206 is executed. Operation 1204 is executed to use the address generated by the address generator 604 to activate the corresponding cell represented by the address. This operation 1204 may be executed by the predecoder 605. Operation 1205 is executed to read data from the TSVs and store it in the activated cells. Operation 1206 is executed to wait for the processor, associated with the socket 101, to send the next request (e.g., a backup request).

In some example embodiments, the methods illustrated herein are stored in a removable physical storage medium that is shown to be a single medium, and the term "machine-readable medium" should be taken to include a single medium or multiple medium (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any of the one or more of the methodologies illustrated herein. The term "machine-readable medium" shall accordingly be taken to include, but not be limited to, solid-state memories, optical and magnetic medium, and carrier wave signals.

The methods referenced herein may be written as data and instructions stored in storage devices, which are implemented as one or more computer-readable or computer-usable storage media or mediums. The storage media include different forms of persistent and non-persistent memory. Note that the instructions of the software discussed above can be provided on one computer-readable or computer-usable storage medium, or alternatively, can be provided on multiple computer-readable or computer-usable storage media distributed in a large system having possibly plural nodes. Such computer-readable or computer-usable storage medium or media is (are) considered to be part of an article (or article of manufacture). An article or article of manufacture can refer to any manufactured single component or multiple components.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the "true" spirit and scope of the invention.

What is claimed is:

1. A computer system comprising:
a memory die, residing on a stacked memory, that is organized into a plurality of mats that include data;
an additional memory die, residing on the stacked memory, that is organized into an additional plurality of mats and connected to the memory die by a Through Silicon Vias (TSVs), wherein the data is to be transmitted along the TSVs;
an address generator to generate addresses for sub-array memory cells in the plurality of mats; and
a multiplexor to receive a control signal to retrieve an address from the address generator for one of the sub-array memory cells.

2. The computer system of claim 1, wherein each of the addresses generated by the address generator is associated with one of the sub-array memory cells.

3. The computer system of claim 1, wherein the address generator generates the addresses as part of at least one of a memory read or memory write operation.

4. The computer system of claim 1, further comprising a controller that initiates the transmission of the data along the TSVs.

5. A computer system comprising:
a plurality of sub-arrays grouped as a mat that resides on a memory die, the plurality of sub-arrays including data that is read from at least one of the sub-arrays;
a Through Silicon Via (TSV) control module, associated with the mat, that resides on the memory die, wherein the TSV control module is to control a placement of data on Through Silicon Vias (TSVs) that connects the mat and an additional mat that resides on an additional memory die;
an address generator to generate addresses for the plurality of sub-arrays; and
a multiplexor to receive a control signal to retrieve an address from the address generator for one of the plurality of sub-arrays.

6. The computer system of claim 5, further comprising a stacked memory that includes the memory die and the additional memory die, wherein the stacked memory is part of a Dual In-Line Memory Module (DIMM).

7. The computer system of claim 5, wherein the memory die and the additional memory die are homogenous and have at least one of identical memory area characteristics, or identical memory delay characteristics.

8. The computer system of claim 5, wherein the memory die and the additional memory dies are heterogeneous and have at least one of distinct memory delay characteristics, or distinct area characteristics.

9. The computer system of claim 5, wherein the multiplexor is further to receive a signal that instructs the multiplexor to direct, through the TSVs, the data to the additional mat that resides on the additional memory die.

10. A computer system comprising:
 a plurality of sub-arrays grouped as a mat that resides on a memory die that are connected by Through Silicon Vias (TSVs) to an additional plurality of sub-arrays grouped as an additional mat that resides on an additional memory die, wherein the additional plurality of sub-arrays is to receive data to be written to at least one of the additional plurality of sub-arrays;
 a controller to generate a signal to identify an address associated with the at least one of the additional sub-arrays where the data is to be written;
 an address generator, associated with the mat, to generate addresses for the plurality of sub-arrays; and
 a multiplexor, associated with the mat, to receive the signal from the controller to retrieve an address from the address generator for one of the plurality of sub-arrays.

11. The computer system of claim 10, wherein the signal is received as part of a parallelized check pointing regime.

12. The computer system of claim 10, wherein the controller is at least one of a DIMM controller, a Central Processing Unit (CPU), or a memory controller.

13. The computer system of claim 10, further comprising an additional multiplexor, associated with the additional mat, to receive the data from at least one of an input bus and the TSVs.

14. The computer system of claim 10, wherein the mat and additional mat each have four sub-arrays.

* * * * *